US012803069B2

(12) United States Patent
Beck et al.

(10) Patent No.: US 12,803,069 B2
(45) Date of Patent: Nov. 17, 2026

(54) BATTERY MODULE, ENERGY STORAGE ARRANGEMENT AND METHOD FOR DETECTING LIQUID

(71) Applicant: AUDI AG, Ingolstadt (DE)

(72) Inventors: Wolfgang Beck, Aichach (DE); Martin Bräunig, Murrhardt (DE); Imke Dittmann, Ingolstadt (DE); Thomas Milde, Wüstenrot (DE); Martin Schüssler, Kösching (DE); Roland Tornar, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 845 days.

(21) Appl. No.: 18/170,656

(22) Filed: Feb. 17, 2023

(65) Prior Publication Data

US 2023/0282896 A1 Sep. 7, 2023

(30) Foreign Application Priority Data

Mar. 3, 2022 (DE) ......................... 102022104975.2

(51) Int. Cl.

| | |
|---|---|
| ***H01M 10/48*** | (2006.01) |
| ***H01M 10/42*** | (2006.01) |
| ***H01M 50/264*** | (2021.01) |
| ***H01M 50/284*** | (2021.01) |
| ***H05K 1/189*** | (2026.01) |

(52) U.S. Cl.

CPC ......... *H01M 10/48* (2013.01); *H01M 10/425* (2013.01); *H01M 50/264* (2021.01); *H01M 50/284* (2021.01); *H01M 10/484* (2013.01); *H05K 1/189* (2013.01)

(58) Field of Classification Search

CPC .. H01M 10/48; H01M 10/484; H01M 10/425; H01M 10/4271; H01M 50/264; H01M 50/284; H05K 1/189

See application file for complete search history.

(56) References Cited

U.S. PATENT DOCUMENTS

| | | | |
|---|---|---|---|
| 6,207,045 | B1 | 3/2001 | Jiang |
| 11,909,012 | B2 | 2/2024 | Yamane et al. |
| 2021/0057785 | A1 | 2/2021 | Yamane et al. |

FOREIGN PATENT DOCUMENTS

| | | | |
|---|---|---|---|
| CN | 112406542 | A | 2/2021 |
| DE | 102013212859 | A1 | 1/2014 |
| DE | 102014203919 | A1 | 9/2015 |
| DE | 102015108546 | A1 | 12/2016 |

(Continued)

OTHER PUBLICATIONS

Translation of DE 102018200922 (Year: 2018).*

(Continued)

*Primary Examiner* — Holly Rickman
(74) *Attorney, Agent, or Firm* — Maier & Maier, PLLC

(57) ABSTRACT

A battery module for an energy storage arrangement. The battery module has an underside for arrangement on a housing base of a battery housing, an upper side opposite the underside with respect to a first direction, at least one outer side that is different from the underside and the upper side, and at least one liquid sensor by which a liquid can be detected. In doing so, the liquid sensor has a measuring probe which is arranged on the outer side of the battery module and extends downwards in the direction of the underside of the battery module.

14 Claims, 2 Drawing Sheets

(56) References Cited

FOREIGN PATENT DOCUMENTS

| | | | |
|---|---|---|---|
| DE | 102018200922 | A1 | 7/2019 |
| JP | 2011195069 | A | 10/2011 |
| KR | 1020210097540 | A | 8/2021 |

OTHER PUBLICATIONS

Translation of DE102013212859 (Year: 2013).*
Translation of KR 10-2021-0097540 (Year: 2021).*
Search Report issued on Nov. 17, 2022, in corresponding German Application No. 102022104975.2, 12 pages.
Office Action issued on May 15, 2026, in corresponding Chinese Application No. 202310183080.8, 20 pages.

* cited by examiner

BATTERY MODULE, ENERGY STORAGE ARRANGEMENT AND METHOD FOR DETECTING LIQUID

FIELD

The invention relates to a battery module for an energy storage arrangement, wherein the battery module has an underside for arrangement on a housing base of a battery housing, an upper side opposite the underside with respect to a first direction, at least one outer side that is different from the underside and the upper side, and at least one liquid sensor by means of which a liquid can be detected. Furthermore, the invention also relates to an energy storage arrangement with such a battery module and a method for detecting liquid in the area of a battery module.

BACKGROUND

The invention is preferably located in the field of high-voltage storage systems for vehicles, in particular electric vehicles. Current high-voltage storage systems, such as lithium-ion accumulators, use cooling systems that can contain elements that are inside the battery, i.e. inside the battery housing. In the event of a possible fault, the cooling medium can escape from the cooling system and get inside the storage system. Furthermore, in the event of a fault, water can get into the battery from the outside. Unless they are bound by absorbent material, the liquid media usually remain unbound and can spread or move freely. Such liquid media can lead directly to a fatal fault or failure of the battery if there is a sufficient quantity or if the location is unfavorable. Indirectly, the media mentioned can also lead to further faults in the battery.

In this context, DE 10 2013 212 859 A1 describes a system for mitigating damage to a battery in a vehicle that contains a liquid-cooled battery system, wherein the system contains one or more coolant leak sensors. A coolant leak detection system which is communicatively coupled to the coolant leak sensors may be configured to detect the occurrence of a leak of liquid coolant in the battery system based on information provided by the coolant leak sensors. One or more valves which are communicatively coupled to the coolant leak detection system may be actuated by the coolant leak detection system when a leak of a liquid coolant is detected, thereby facilitating the draining of a spilled liquid coolant from the battery system. The coolant leak sensors can be strategically placed, for example, in the battery system or in the liquid cooling system, near a heat exchanger, near pipe connections, or in one or more strategic places on or near the battery system, the battery stacks or the battery modules.

Such use of several liquid detection sensors requires a great deal of installation space. This is mainly due to the fact that such sensors have to be connected to a measuring unit or a control device, which means that the wiring effort is also very high. However, especially in battery systems, the installation space is severely limited. A further problem is that in the event that a liquid is not reliably detected by the detection system, the draining of the liquid from the battery system cannot be initiated either.

Furthermore, DE 10 2015 108 546 A1 describes a device for draining a liquid that has penetrated into an electrical device, wherein the device has an opening device to open an outlet in the electrical device, wherein the opening device, when the liquid penetrates into the electrical device, can be brought into interaction with the liquid, through which an opening of the outlet can be triggered by the opening device. The opening device may have a cylinder which is at least partially filled with a liquid-absorbent material. In addition, the opening device can also have a sensor device for detecting the opening of the outlet.

However, if the outlet does not open for any reason, the liquid cannot be detected either.

Furthermore, DE 10 2014 203 919 A1 describes a battery system with a connection element and two contacts, which is designed to be connectable to a battery cell or component and with a processing means which is designed to sense an electrical resistance measurement value between the contacts in order to detect a liquid depending thereon. The contacts are arranged on the upper side of the battery cells. However, due to the force of gravity, liquid usually collects on the base of the housing, which cannot be detected by such sensors.

Furthermore, DE 10 2018 200 922 A1 describes a sensor device for recognizing a critical state for a high-voltage storage, with a sensor unit for arranging in a storage housing of the high-voltage storage and for sensing a measurement signal, and with an evaluation unit for evaluating the measurement signal. The sensor device is adapted to recognize a presence of a liquid in the storage housing as a critical state. For this, a sensor unit is integrated into the cooler structure in a very complex manner or is arranged between the cooler and the housing base.

SUMMARY

The object of the present invention is therefore to provide a battery module, an energy storage arrangement and a method which enable the most reliable possible detection of a liquid in the area of a battery module in the simplest and most space-saving manner possible.

A battery module according to the invention for an energy storage arrangement has an underside for arrangement on a housing base of a battery housing, an upper side opposite the underside with respect to a first direction, at least one outer side that is different from the underside and the upper side, and at least one liquid sensor by means which a liquid can be detected. The sensor has a measuring probe which is arranged on the outer side of the battery module and extends downwards in the direction of the underside of the battery module.

The invention is based on the finding that such a liquid sensor, in particular a measuring probe, can be integrated on the outer side of a battery module in a particularly simple and space-saving manner since in this area, i.e. on such an outer side, further electrical and/or electronic components of the battery module, for example a cell module controller (CMC), which is also referred to below as a cell module controller or is referred to as a module control unit, are usually already arranged. The liquid sensor can thus be integrated into already existing electrical or electronic components in a particularly simple manner or be embodied as part of such a component, as a result of which only a small modification of such a component is necessary. Additionally, the measuring probe can be electrically connected to such a component like the cell module controller in a simple manner, so that the overall wiring effort can also be reduced to a minimum. For example, the sensor can be arranged on the circuit board covered by the cell module controller. At the same time, it is nevertheless possible, due to the downwardly extended embodiment of the measuring probe, to reliably detect liquid in the area of the battery module, in particular in the area of its underside. It is precisely there that liquid collects first due to gravity. The fact that the liquid sensor or its measuring probe is provided on an outer side different from the upper and underside of the battery module has the additional advantage that the upper and/or underside of the battery module can be connected to a heat sink or a cooling means in an efficient manner. Moreover, liquid can still be reliably detected in the area of the underside of the battery module, which is possible because the measuring probe is designed to extend downwards. At the same time, no complex integration of the measuring probe into a cooling structure or the like is required. The previous design and conception of an energy storage with such a battery module remains completely unaffected by the additional provision of such a liquid sensor. The invention thus provides a particularly simple, efficient and, above all, installation space-saving possibility of reliably detecting liquids in the area of the underside of a battery module and thus protecting the battery module in good time from damage caused by liquids, e.g. by issuing a warning, switching off the battery system, draining the liquid and/or taking other action.

The energy storage arrangement for which the battery module is preferably provided can be, for example, a high-voltage energy storage of a motor vehicle, which is also referred to simply as a high-voltage battery below. Such high voltage battery can also have several such battery modules. Furthermore, if the high-voltage battery has several such battery modules, at least one specially assigned liquid sensor can be provided for each battery module. This automatically results in a distributed arrangement of liquid sensors, which makes it possible to independently detect liquids at different positions in a battery system. This increases reliability and safety. In addition, it is also possible for the battery module to have not only one such sensor, but also two or more, for example. For example, a further liquid sensor can be arranged on an opposite outer side of the battery module. As a result, reliability and safety can be further increased. The terms upper side and underside can refer to the preferred or intended installation position of the battery module in a motor vehicle. In this case, the first direction mentioned above would be aligned parallel to a vertical axis of the vehicle. As explained in more detail later, the battery module can have one or more battery cells. Such battery cells can be formed, for example, as lithium-ion cells. The battery cells can furthermore generally be designed as prismatic battery cells, pouch cells or round cells, wherein the design of the battery cells as prismatic cells or pouch cells is particularly advantageous in the context of the arrangement geometry of the liquid sensor described in more detail below. This is because they can be combined into cell stacks or cell packs and spanned by a frame, which can then at the same time also act as a carrier for the liquid sensor or its measuring probe.

A measuring probe is to be understood in particular as meaning the part of the liquid sensor which, in order to detect a liquid, has to come into direct physical contact with this liquid. The presence of the liquid can be detected by the liquid sensor through the contact of the liquid with the measuring probe. In the simplest case, the liquid sensor can be based on a resistance measurement. Two electrical conductors can be provided as measuring probes, for example, which are at a distance from one another and are electrically insulated from one another by this distance, so that when a voltage is applied between first conductor ends of these two conductors, no current flows through the conductors, at least not in the normal state. However, if the opposite conductor ends are immersed in a liquid, this liquid creates a conductive connection between the two conductor pieces and the resistance between the two conductors is reduced. This can also be sensed on the basis of the current flow that is now present. Capacitive sensing or a different design of such a liquid sensor would also be conceivable. For example, in the case of the resistance-based liquid sensor, the wires described can be thought of as the measuring probes. In addition, it is also conceivable that the liquid sensor is embodied with a wick as a measuring probe that can absorb liquid media in a targeted manner and then forward it to a detection unit of the liquid sensor. Signal evaluation can be by an evaluation means of the liquid sensor, which, however, does not necessarily have to be in spatial proximity to the measuring probe. Signal evaluation can be, for example, by the cell module controller or by a higher-level battery control device. Correspondingly, the evaluation means of the liquid sensor can be part of such a module control unit or of the battery control device. The measuring probe can correspondingly be connected to such a module control unit or to the battery control device, in particular again indirectly via the module control unit.

It is therefore a further very advantageous configuration of the invention if the battery module has a module control unit, wherein the measuring probe is electrically connected to the module control unit, and wherein the module control unit is adapted to evaluate a measurement signal provided by the measuring probe and/or to forward it to a battery control device. Such a module control unit is assigned precisely to the battery module. If the high-voltage battery has several battery modules, each battery module can be assigned its own module control unit. The module control units can in turn be electrically and/or communicatively connected to a higher-level battery control device. In the present case, the module control unit is part of the battery module. As will be described later in more detail, it is preferably also arranged on an outer side of the battery module. Due to the spatial proximity to the module control unit, the measuring probe can therefore be electrically connected to this module control unit in a particularly simple manner without a great deal of wiring effort. At the same time, the module control unit can easily take over the evaluation of the measurement signals provided by the measuring probe. Alternatively, the module control unit can also forward these measurement signals to the above-mentioned higher-level battery control device, which can then take over the evaluation of these measurement signals accordingly. If the presence of a liquid is detected on the basis of the evaluation of these measurement signals, a further safety measure can in turn be initiated depending thereon. Such a safety measure can comprise, for example, issuing a warning to the driver of the motor vehicle and/or switching off the battery system which comprises the battery module. It is also possible to then initiate measures to drain the liquid from the battery housing in which the battery module is accommodated. However, such liquid drainage is preferably performed by independent water drain valves, as will be described later in more detail.

In a further very advantageous configuration of the invention, the battery module has a cell stack with at least one battery cell and a module housing with a module frame, which is arranged circumferentially around the cell stack and which provides the at least one outer side, wherein at least one electrical and/or electronic component is arranged on the outer side, and wherein the measuring probe is designed as part of the component. This enables a particularly efficient and installation space-saving provision of the measuring probe. Such an electrical and/or electronic component can simply have a structural extension downwards, i.e. in the direction of the underside of the battery module, for the purpose of providing such a measuring probe. By providing the measuring probe as part of such an electrical and/or electronic component, the electrical connection of the measuring probe to such a component for the purpose of signal evaluation and/or forwarding is also particularly simple and installation space-efficient.

The cell stack preferably has not only one single battery cell, but rather several battery cells arranged next to one another in the stacking direction, wherein the stacking direction correspondingly is perpendicular to the first direction defined above. Such a cell stack can, for example, be delimited on both sides in the stacking direction by so-called end plates. These may represent a part of the frame mentioned above. The two end plates may be connected to one another in the stacking direction by two side plates which face each other with respect to a third direction which is perpendicular to the first direction and perpendicular to the stacking direction. These can also be part of the module frame. A module frame is thus provided by these two side plates and the end plates, which encloses a cuboid accommodation area in which the cell stack with the at least one battery cell is arranged accordingly. The end plates and the side plates can then correspondingly provide four outer sides of the battery module, for example, wherein the measuring probe can be arranged on at least one of these four outer sides, in particular as part of the electrical and/or electronic component described.

In a very advantageous configuration of the invention, the module control unit represents the component, in particular wherein the module control unit is arranged on an end face of the battery module that is provided by an end plate of the frame that delimits the cell stack with respect to a stacking direction perpendicular to the first direction. Due to the fact that the measuring probe is designed only as part of the module control unit, the measuring unit can also be electrically connected thereto in a particularly simple manner. In particular, for example, the measuring probe or at least a large part of it can be accommodated in the same housing of the module control unit in which the other components of the module control unit are also accommodated. For this purpose, the housing of the module control unit can also be designed extended in the direction of the underside of the battery module. At the same time, the measuring probe can be accommodated there in a particularly protected manner. In addition, this allows the measuring probe to be provided in an installation space that is usually unused anyway. Additional installation space must then be provided for the integration of such a liquid sensor.

According to a further very advantageous configuration of the invention, the battery module has a flexible printed circuit board, by means of which at least one measured cell variable relating to the battery cell can be provided to the module control unit of the battery module, wherein the flexible printed circuit board represents the component. In other words, the measuring probe can also be designed as part of this flexible printed circuit board or be connected to it. The flexible printed circuit board can also be designed with a local extension in the direction of the underside of the battery module, on which the measuring probe of the liquid sensor can be arranged. The flexible printed circuit board typically carries the conductor tracks that supply various measured values of the battery cells of the battery module to the module control unit. Such measured variables are, for example, the sensed cell voltages, the sensed module voltage, the cell currents or the module current, cell temperatures or module temperatures and so on. These variables are therefore supplied to the module control unit in accordance with the electrical variables via the flexible printed circuit board. The flexible printed circuit board thus comprises the electrically conductive connections between corresponding measurement taps on the battery cells or on the cell stack and the module control unit. For example, the flexible circuit board can be routed along the side plates described above, up to the module control unit. The module control unit can have a connection means, for example, into which a corresponding connection means of the flexible printed circuit board can be plugged. Such a connection means can in turn have several individual connections which correspond to respective inputs or input signals. The measuring probe of the liquid sensor can then advantageously occupy a further input of this type or be routed to such an input of the module control unit via the flexible printed circuit board. The liquid sensor or the measuring probe can thus be integrated into existing components in a particularly simple and efficient manner.

As already mentioned, the battery module can also have several liquid sensors. Accordingly, it is also conceivable that, for example, one of these sensors is embodied as part of the module control unit itself and another one, for example, as part of the flexible printed circuit board. It is particularly advantageous, for example, if such a liquid sensor or a measuring probe is provided on a respective end plate or on a respective end face of the battery module. Reliable liquid detection can thus be provided at both ends of the battery module. In this way, at least one of the sensors can detect liquid present in the room even in case of different orientations of the battery module. This is very advantageous since a motor vehicle which can comprise such a battery module is typically not permanently horizontal.

In order to further increase the reliability in the detection of liquids, there are numerous further measures which will now be explained in more detail below, in particular in the context of the energy storage arrangement according to the invention or its configurations.

The invention thus also relates to an energy storage arrangement with a battery module according to the invention or one of its configurations. The advantages described for the battery module according to the invention and its configurations thus apply similarly to the energy storage arrangement according to the invention.

Furthermore, it is preferred that the energy storage arrangement has a battery housing with a housing base, on which the battery module is arranged with the underside facing the housing base. As already mentioned above, the energy storage arrangement can be designed as a high-voltage battery, for example. In addition to the battery module, further battery modules can also be accommodated in the battery housing, which in particular can all be designed in the same way. In other words, these further battery modules can be designed as described for the battery module according to the invention or its configurations.

The battery module is now arranged with its underside facing the housing base in the battery housing. As a result, the liquid sensor can detect liquids in the area of this housing base in a particularly simple and reliable manner.

According to a further advantageous configuration of the invention, it is provided that the measuring probe is at a predetermined distance from a base area of the housing base which is arranged directly below the measuring probe in relation to the first direction, in particular wherein the housing base has at least one depression in relation to the first direction, which is arranged in the base area.

The fact that the measuring probe is at a certain distance from the base area has the advantage that only small amounts of liquid do not immediately trigger the liquid sensor. Such small amounts of liquid occur relatively frequently in the context of condensation occurring in the battery housing. However, these small amounts of liquid do not affect the operation of the high-voltage battery. A triggering of the liquid sensor in this case is therefore undesirable. Opening an outlet valve or the like based on this would only result in the interior of the battery housing being contaminated through the fluidic connection to the outside. In addition, some outlets are designed such that they can no longer be reversibly closed. In this case, a visit to the workshop is essential. Due to the fact that the measuring probe is at a specific distance from the housing base, in particular from the base area over which the measuring probe is arranged, too frequent false triggering can be efficiently avoided. Condensation water occurring in the high-voltage storage system does not affect the system when used as intended.

Irrespective of this, it can also be provided that the housing base has a depression in said base area directly below the measuring probe. For example, the measuring probe can also partially protrude into this depression. This has the advantage that liquids collect in this depression, even when the motor vehicle is in a slight incline, so that liquids can also be reliably detected in this case. The detection reliability can thus be further increased by the provision of such a depression. In this case, however, it can also be provided that the measuring probe is at a certain distance from this depressed base area, although the deepest point of the measuring probe can also protrude lower than surrounding raised areas of the housing base. In other words, although the lowest point of the measuring probe can be arranged lower, in particular in relation to the first direction defined above, than some other areas of the housing base, which surround the depression, for example, the lowest point cannot be in direct contact with the base area in this depression, but also have a certain distance thereto. Condensate can also accumulate in the depression, but does not immediately trigger the liquid sensor either.

According to a further very advantageous configuration of the invention, the housing base has at least one bead or a bead pattern for collecting condensate liquid which cannot be detected by at least one liquid sensor in a condition in the at least one bead. Such beads in the housing base also advantageously make it possible for small amounts of liquid, such as the condensate described above, to collect in these beads. These then do not reach the base area below the liquid sensor and therefore cannot be detected by the measuring probe. Such beads also advantageously make it possible to prevent the liquid sensor from being triggered in the event of harmless, small amounts of liquids in the housing. Incidentally, a bead pattern can be understood to mean an arrangement of several beads. These are preferably arranged in areas of the housing base on which no battery modules are arranged.

In addition, it is also conceivable, as already mentioned, that the liquid sensor is embodied with a wick as a measuring probe that can absorb liquid media in a targeted manner and then forward it to the detection unit. This in turn can be integrated in the CMC or located on the flexible printed circuit board. Existing liquids thus rise through such a wick due to the capillary effect, wherein the height of rise in turn is dependent on the amount of liquid. As a result, larger amounts of liquid can be reliably detected. Such a wick can also be configured such that small amounts of liquid do not lead to triggering. Alternatively or additionally, it can also be provided here that such a wick has a certain minimum distance from the base area.

In a further very advantageous configuration of the invention, the housing base has at least one water drain valve, which is set up such that it opens depending on the presence of liquid in the area of the water drain valve in order to drain the liquid out of the battery housing, wherein the at least one water drain valve is designed to open independently of a detection of the liquid by the at least one liquid sensor when liquid is present in the area of the at least one water drain valve. In other words, such a water drain valve is not embodied as a controllable valve, but as one that can open automatically as soon as liquid or a specific minimum amount of liquid occurs in the area of the water drain valve. The water drain valve can also be embodied to be purely mechanical or be based on a chemical reaction. For example, such a water drain valve can be embodied with a closure that dissolves on contact with liquid or dissolves on contact with a specific liquid, thereby releasing the opening from the housing. Such a valve can also be adapted to open when there is sufficiently high pressure on the valve, which can be caused by the weight of the liquid resulting from the accumulation of liquid on the valve. The valve can also be designed with a material which contracts when it is wet or when it comes into contact with liquid or the like, thereby releasing an opening. Numerous further design possibilities for such a passive opening of the water drain valve are also conceivable. As a result, the opening of such a water drain valve is advantageously independent of the detection of the liquid by means of the liquid sensor. This gives an additional, redundant safety mechanism, which, however, is based on a different measuring principle and is also arranged at a different location. Such a passive water drain valve advantageously does not require a control mechanism. This in turn simplifies the wiring effort, which in particular can then also be completely eliminated. Even if, for example, the liquid sensor itself does not trigger, although there is liquid in the battery housing, the passive water drain valve can still ensure that the liquid drains reliably in this case. Also in the opposite case, if the water drain valve should not open for some reason, the liquid can still be detected by means of the liquid sensor and, for example, a corresponding warning message can be issued or another safety measure can be initiated. In both cases, the liquid present is at least not completely ignored.

In a further very advantageous configuration of the invention, the at least one water drain valve has an opening sensor which is designed to detect an opening of the at least one water drain valve and to report this to a control means, in particular to the module control unit or the battery control device of the energy storage arrangement. As a result, the opening of this water drain valve can advantageously also be detected. If the liquid sensor does not detect the liquid present, for example, while the water drain valve opens due to the liquid present, this can advantageously be detected by the opening sensor and reported to a control means. This reduces the risk of any liquid present in the housing going unnoticed. In the event of a fault, the water can be drained immediately and automatically from the battery by the drain valve described. This optional water drain valve is also preferably equipped with a suitable sensor system, which is referred to here as an opening sensor. Such a sensor, that is to say the opening sensor, can be transmitted electrically, for example via a cable or via suitable wireless transmission paths to the CMC or to other control devices.

In addition, it is particularly advantageous if the battery housing has several such water drain valves. It has proven to be particularly advantageous to provide such a water drain valve in a corner of the battery housing base. These water drain valves are preferably placed in the system such that the water can be drained off in any vehicle position, i.e. also in the event of a slope or an incline, and so on. Such a valve is advantageously accommodated in each corner of the high-voltage storage. The battery housing base is preferably embodied to be rectangular, so that preferably four such water drain valves are provided in total. As a result, reliable detection of liquids in the housing can always be guaranteed, regardless of the current incline of the energy storage arrangement.

Furthermore, a motor vehicle with a battery module according to the invention or one of its configurations, or with an energy storage arrangement according to the invention or one of its configurations should also be regarded as belonging to the invention.

The motor vehicle according to the invention is preferably configured as an automobile, in particular as a passenger car or truck, or as a passenger bus or motorcycle.

Furthermore, the invention also relates to a method for detecting liquid in the area of a battery module for an energy storage arrangement, wherein the battery module has an underside for arrangement on a housing base of a battery housing and an upper side opposite the underside with respect to a first direction, and at least one outer side which is different from the underside and the top. Furthermore, the battery module comprises at least one liquid sensor, by means of which a liquid is detected. In this case, the liquid is detected by means of a measuring probe of the liquid sensor which is arranged on the outer side of the battery module and extends downward in the direction of the underside of the battery module.

The advantages mentioned for the battery module according to the invention and its configurations and for the energy storage arrangement according to the invention and its configurations also apply here in the same way to the method according to the invention.

The invention also includes further developments of the method according to the invention, which have features as already described in the context of the further developments of the battery module according to the invention and the energy storage arrangement according to the invention. For this reason, the corresponding further developments of the method according to the invention are not described again here.

The invention also comprises the combinations of the features of the described embodiments. The invention also comprises implementations that each have a combination of the features of several of the described embodiments, unless the embodiments were described as mutually exclusive.

BRIEF DESCRIPTION OF THE FIGURES

Exemplary embodiments of the invention are described hereinafter. In the figures.

DETAILED DESCRIPTION

Figure 1:
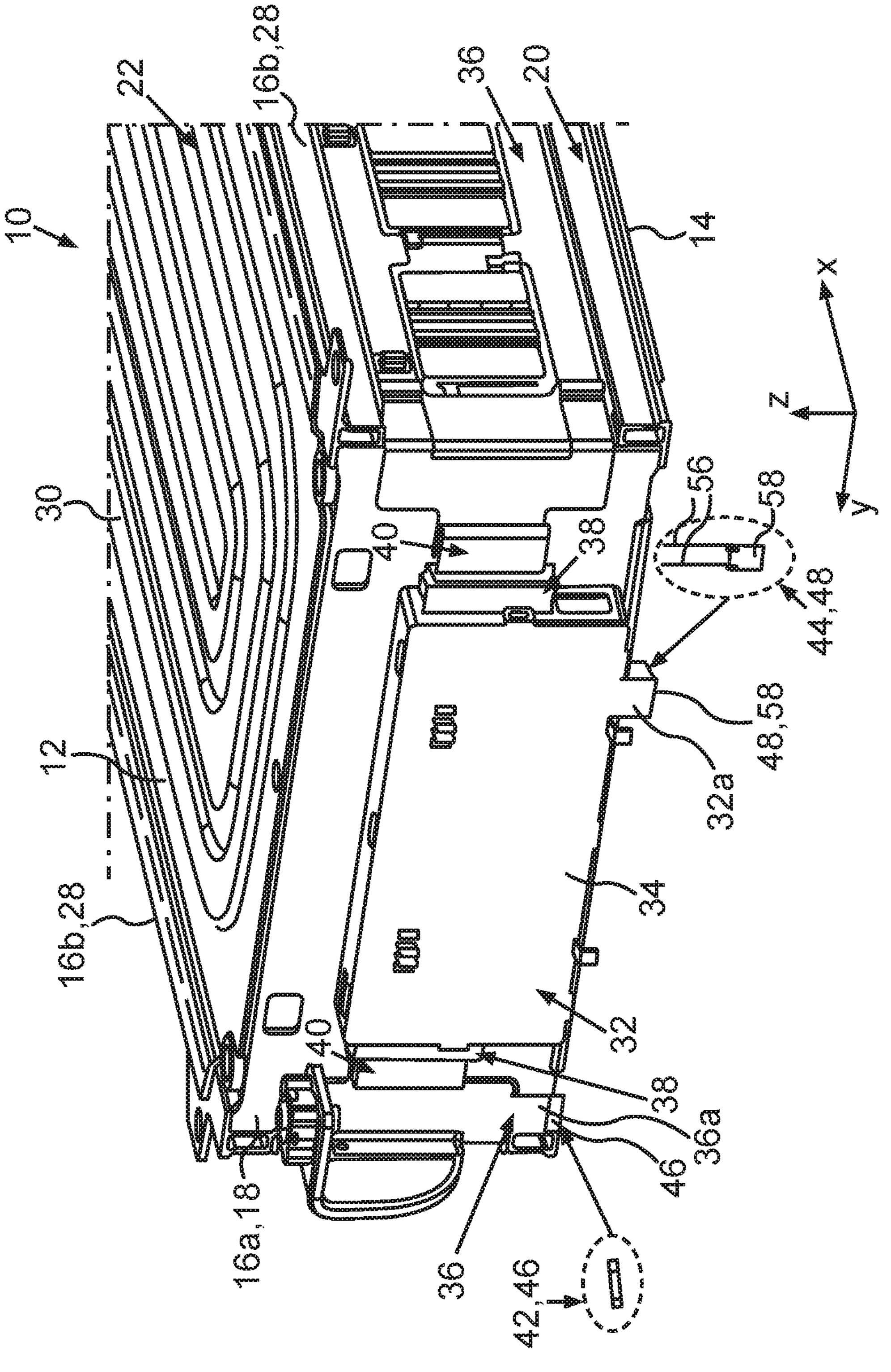
FIG. 1 shows a schematic and perspective representation of a part of a battery module according to an exemplary embodiment of the invention.

The exemplary embodiments explained hereinafter are preferred embodiments of the invention. In the exemplary embodiments, the described components of the embodiments each represent individual features of the invention to be considered independently of one another, which each also refine the invention independently of one another. Therefore, the disclosure is also intended to comprise combinations of the features of the embodiments other than those represented. Furthermore, the described embodiments can also be supplemented by further features of the invention as already described.

In the figures, same reference numerals respectively designate elements that have the same function.

FIG. 1 shows a schematic representation of a part of a battery module 10 according to an exemplary embodiment of the invention. In this example, the battery module 10 has an upper side 12 and an opposite lower side 14 with respect to the z-direction. Furthermore, the battery module has outer sides 16*a*, 16*b* different from the upper side 12 and the lower side 14. The outer side 16*a* represents an end face 16*a* of the battery module 10 which is provided by an end plate 18 of a frame 20 of a module housing 22. This frame 20 has two such end plates 18, wherein here, only one is represented in FIG. 1. These end plates 18 delimit a cell stack 24 accommodated in the module housing 20 (cf. FIG. 2) in the stacking direction, which corresponds to the x-direction represented here. The battery module 10 therefore also comprises such a cell stack 24 with several battery cells 26 (also cf. FIG. 2), which are arranged next to one another in the stacking direction x. The two end plates 18 can be connected to one another and braced by two side plates 28. The end plates 18 and the side plates 28 are correspondingly part of the frame 20 or provide it. In addition to the frame 20, the module housing 22 in this example also comprises a housing cover 30, through which cooling of the battery cells 26 can optionally also be provided.

Furthermore, the battery module 10 has a module control unit 32, which is also referred to below as a cell module controller or simply CMC. This CMC 32 is arranged on one of the end plates 18 and fixed thereto. The CMC 32 has a housing 34 in which the electrical and electronic components of the CMC 32 are arranged. Furthermore, the battery module 10 also comprises a flexible printed circuit board 36, in particular several such flexible printed circuit boards 36, which are also referred to as flexible printed circuits "FPC". These carry the conductor tracks, via which various electrical measured variables can be routed from the cells 26 of the cell stack 24 to the CMC 32. For this purpose, the CMC 32 comprises a corresponding connection means 38, in particular on both sides with respect to the y-direction, which provide corresponding interfaces into which corresponding plugs 40 of the flexible printed circuit boards 36 can be plugged. These interfaces 38 can comprise several pins which correspond to respective inputs. For example, a measured variable can be assigned to each input. It is not necessary for all inputs to be assigned a measured variable or for an input signal to be provided at this input.

Advantageously, the battery module 10 now has at least one liquid sensor. In the present example, two such liquid sensors 42, 44 are illustrated. In particular, the measuring probes 46, 48 of these liquid sensors 42, 44 are represented here. There are now two particularly advantageous possibilities for arranging such liquid sensors 42, 44 on the outer side 16*a*, 16*b* of the battery module 10. On the one hand, the flexible printed circuit board 36 is extended in an area up to the base plate of the battery 50 (cf. FIG. 2), wherein the base plate represents an exemplary embodiment of the housing base 52 of the battery housing 54 (also cf. FIG. 2). This extended part of the flexible printed circuit board 36 is referred to here as 36*a*. The measuring probe 46 of the liquid sensor 42 is integrated at the lower end of this extended part 36*a*. For better illustration, the measuring probe 46 of the liquid sensor 42 is again represented separately in an enlarged representation in FIG. 1. Such a measuring probe 46 can be embodied to be extremely small and have dimensions that are smaller than the diameter of a one-cent coin, in particular even significantly smaller than the radius of such a one-cent coin. Such a measuring probe 46 can thus be integrated into already existing electrical or electronic components of the battery module 10 in a particularly installation space-saving manner. The sensor 42 or the measuring probe 46 can be embodied as a surface mounted device (SMD), i.e. a surface-mounted component, with which the FPC, i.e. the flexible printed circuit board 46, is fitted. The measuring probe 46 can also be connected to the CMC 32 via the flexible printed circuit board 36, in particular via the plug 40 and the corresponding connection means 38 of the CMC 32. For this purpose, for example, one of the pins mentioned above can be used to provide the measuring signal provided by the measuring probe 46 as an input signal. As a result, the electrical connection to a control means, namely the CMC 32, is particularly efficient, simple, installation space-saving and does not require a great deal of cabling.

At the same time, the CMC 32 can function as an evaluation unit of the liquid sensor 42 and evaluate the measurement signals supplied. Alternatively or additionally, the CMC 32 can forward these measurement signals or variables derived therefrom to a higher-level battery control device not represented here, which takes over the evaluation of these signals. Depending on the evaluated signals, a corresponding measure can in turn be initiated when a liquid is detected, for example a warning can be issued to a driver or switching-off of the battery system 50 (cf. FIG. 2) can be initiated, or the like.

A further advantageous possibility for integrating a liquid sensor, the second liquid sensor 44 or its measuring probe 48 in the present case, consists in integrating it into the CMC 32 itself. For this purpose, the CMC 32 can also be embodied with a downward extension 32*a*, i.e. in the direction of the underside 14 of the battery module 10. In this extension 32*a*, in particular of the housing 34 of the CMC 32, the measuring probe 48 can now advantageously be integrated. Here as well, the measuring probe 48 of the liquid sensor 44 is again represented separately in an enlarged representation in FIG. 1 for better illustration. The PCB (printed circuit board), i.e. the circuit board of the CMC 32, can be fitted with the sensor 44 accordingly. In other words, the represented ends 56 of the sensor 44 may be connected to the circuit board of the CMC 32. The sensor signals supplied by the sensor or the measuring probe 48 can be tapped off via these ends 56. A voltage, which is also provided by the CMC 32, can be applied to these ends 56, for example for a resistance measurement. If the lower end 58 of the measuring probe 48 comes into contact with liquid, the resistance between the conductors is reduced correspondingly, which can be detected via the ends 56 accordingly.

Figure 2:
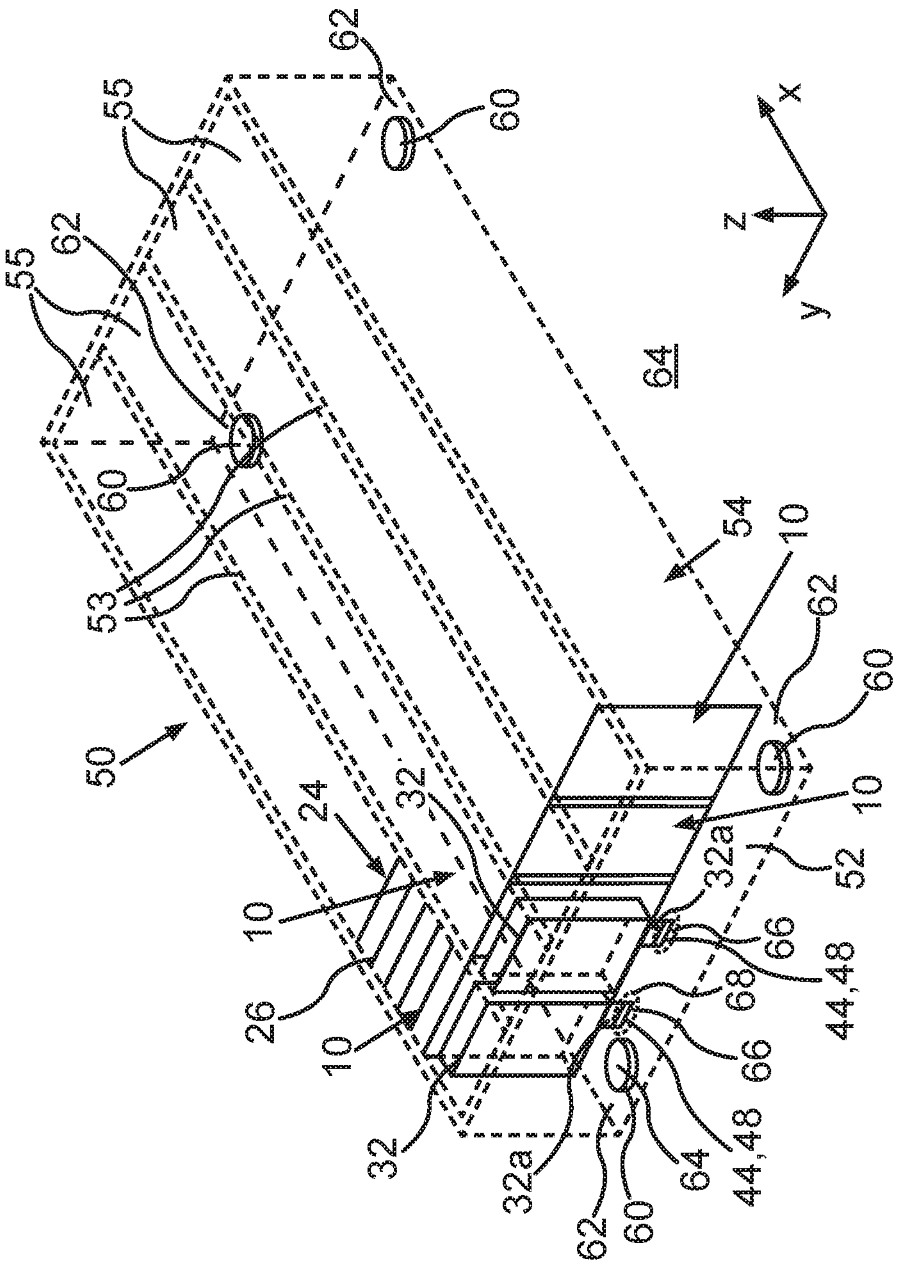
FIG. 2 shows a schematic and perspective representation of a high-voltage battery according to one exemplary embodiment of the invention.

FIG. 2 shows a schematic representation of an energy storage arrangement embodied as a high-voltage energy storage or high-voltage battery 50. As already mentioned, it has a battery housing 54 in which one or more battery modules 10 can be accommodated. In this example, the battery housing comprises several partition walls 53 which divide the interior of the battery housing 54 into several accommodation areas 55 for accommodating a respective battery module 10. These battery modules 10 can be designed as already described for FIG. 1. Four such battery modules 10 arranged next to one another in the y-direction are represented here as an example, or only represented in outline for reasons of clarity. The respective cell stack 24 of a respective battery module therefore preferably extends substantially to the end of the respective accommodation area 55 in the x-direction.

Furthermore, it is very advantageous if the housing base 52 of the battery housing 54 has at least one water drain valve 60. In this example, the energy storage 50 comprises four such water drain valves 60 which are arranged in the respective corners 62 of the housing base 52. These can be embodied as purely mechanical valves 60 or chemical-mechanical valves, which in particular open automatically as soon as they come into contact with liquid or a specific minimum amount of liquid, in particular optionally also a specific liquid. This means that these water drain valves 60 can be opened, regardless of whether one of the liquid sensors 42, 44 detects a liquid or not. In the event of a fault, the water can hereby be led out of the battery 50 immediately and independently. If such a valve 60 opens, it thus creates a fluidic connection between the interior of the battery housing 54 and an environment 64 of the battery housing, in particular an environment of the motor vehicle in which the energy storage 50 is used. Due to the fact that four such valves 60 are now placed in the corners 62, such water can be drained off in any vehicle position. It is therefore very advantageous if such a valve 60 is accommodated in each corner of the high-voltage storage 50, in particular in the base area.

In addition, such a valve 60 can also have a sensor system 64, which is only represented as an example for such a valve 60 in the present case. By means of such a sensor system 64, it can be detected, for example, when the associated valve 60 in question opens. The opening of the valve, which is detected by the sensor system 64, can in turn be reported to the CMC 32 or another higher-level control device or transmitted thereto, for example via a cable or a suitable wireless transmission possibility.

It can furthermore be provided that the base 52 of the battery housing 54 has a bead pattern with one or more beads in order to collect small amounts of condensate. As a result, small amounts of condensate do not lead to an immediate triggering of either the valves 60 or the liquid sensors 42, 44. It is furthermore conceivable that the housing 54 or its add-on part, i.e. the base plate 52, is additionally provided in the base area 52 of the battery 50, which allows water to collect, for example a beading or depression 66 below in the plate 52. In other words, the housing base 52 can have a depression 66. Such a depression 66 is preferably arranged in the area 68 of the housing base 52, which is located directly below a respective measuring probe 46, 48 with respect to the z-direction. Thus, in the event of a fault, the sensor system 44, 42 can be the first to come into contact with the liquid media. The measuring probes 46, 48 can protrude into these depressions 66 in a somewhat depressed manner opposite to the z-direction.

Overall, the examples show how the invention can provide a system for water detection in a high-voltage storage system with an optional water drain valve. The fault of liquids which are free or become free can be recognized in good time by a suitable sensor system and measures can be initiated or are initiated mechanically, for example by triggering a valve, and are recognized by a suitable sensor system, for example a sensor on the valve. Condensation water occurring in the high-voltage storage system does not affect the system when used as intended, and small amounts of condensate can be caught and collected by a suitable bead pattern in the battery base plate.

The invention claimed is:

1. A battery module for an energy storage arrangement, comprising:

an underside for arrangement on a housing base of a battery housing;

an upper side opposite the underside with respect to a first direction;

a cell stack with at least one battery cell;

a module housing with a module frame which is arranged circumferentially around the cell stack and provides at least one outer side that is different from the underside and the upper side;

at least one electrical and/or electronic component arranged on the at least one outer side, wherein the at least one electrical and/or electronic component comprises a module control unit arranged on and fixed to an end plate of the module frame, the end plate providing an end face of the battery module, wherein the at least one outer side includes the end face, wherein the module control unit includes a housing in which electrical and electronic components of the module control unit are arranged, and wherein the housing includes a downward extension extending in the direction of the underside of the battery module; and at least one liquid sensor by which a liquid can be detected, wherein the at least one liquid sensor has a measuring probe, wherein the measuring probe is arranged on the at least one outer side, is designed as part of the at least one electrical and/or electronic component, is integrated in the downward extension of the housing of the module control unit, and extends downwards in the direction of the underside of the battery module.

2. The battery module according to claim 1, wherein the measuring probe is electrically connected to the module control unit, and wherein the module control unit is adapted to evaluate a measurement signal provided by the measuring probe and/or forward the measurement signal to a battery control device.

3. The battery module according to claim 1, wherein the end plate delimits the cell stack with respect to a stacking direction perpendicular to the first direction.

4. An energy storage arrangement with a battery module according to claim 1, wherein the energy storage arrangement has a battery housing with a housing base on which the battery module is arranged with the underside facing the housing base.

5. The energy storage arrangement according to claim 4, wherein the measuring probe is at a predetermined distance from a base area of the housing base that is arranged directly below the measuring probe in relation to the first direction, wherein the housing base has at least one depression with respect to the first direction, the at least one depression being arranged in the base area.

6. The energy storage arrangement according to claim 4, wherein the housing base has at least one bead for collecting condensate liquid that cannot be detected by the at least one liquid sensor when the condensate liquid it is in the at least one bead.

7. The energy storage arrangement according to claim 4, wherein the housing base has at least one water drain valve configured to open depending on the presence of liquid in an area of the at least one water drain valve in order to drain the liquid out of the battery housing, wherein the at least one water drain valve is adapted to open independently of a detection of the liquid by the at least one liquid sensor when liquid is present in the area of the at least one water drain valve.

8. The energy storage arrangement according to claim 7, wherein the at least one water drain valve has an opening sensor configured to detect an opening of the at least one water drain valve and to report the opening to a control device of the energy storage arrangement.

9. A method for detecting liquid in the area of a battery module for an energy storage arrangement, wherein the battery module has:

an underside for arrangement on a housing base of a battery housing;

an upper side opposite the underside with respect to a first direction;

a cell stack with at least one battery cell;

a module housing with a module frame which is arranged circumferentially around the cell stack and provides at least one outer side that is different from the underside and the upper side;

at least one electrical and/or electronic component arranged on the at least one outer side, wherein the at least one electrical and/or electronic component comprises a module control unit arranged on and fixed to an end plate of the module frame, the end plate providing an end face of the battery module, wherein the at least one outer side includes the end face, wherein the module control unit includes a housing in which electrical and electronic components of the module control unit are arranged, and wherein the housing includes a downward extension extending in the direction of the underside of the battery module; and at least one liquid sensor, the method comprising:

detecting a liquid using a measuring probe of the at least one liquid sensor, wherein the measuring probe is arranged on the at least one outer side, is designed as part of the at least one electrical and/or electronic component, is integrated in the downward extension of the housing of the module control unit, and extends downwards in the direction of the underside of the battery module.

10. The energy storage arrangement according to claim 5, wherein the housing base has at least one bead for collecting condensate liquid that cannot be detected by the at least one liquid sensor when the condensate liquid is in the at least one bead.

11. The energy storage arrangement according to claim 5, wherein the housing base has at least one water drain valve configured to open depending on the presence of liquid in an area of the at least one water drain valve in order to drain the liquid out of the battery housing, wherein the at least one water drain valve is adapted to open independently of a detection of the liquid by the at least one liquid sensor when liquid is present in the area of the at least one water drain valve.

12. The energy storage arrangement according to claim 6, wherein the housing base has at least one water drain valve configured to open depending on the presence of liquid in an area of the at least one water drain valve in order to drain the liquid out of the battery housing, wherein the at least one water drain valve is adapted to open independently of a detection of the liquid by the at least one liquid sensor when liquid is present in the area of the at least one water drain valve.

13. The energy storage arrangement according to claim 11, wherein the at least one water drain valve has an opening sensor configured to detect an opening of the at least one water drain valve and to report the opening to a control device of the energy storage arrangement.

14. The energy storage arrangement according to claim 12, wherein the at least one water drain valve has an opening sensor configured to detect an opening of the at least one water drain valve and to report the opening to a control device of the energy storage arrangement.

* * * * *